(12) United States Patent
Panditd et al.

(10) Patent No.: US 7,990,195 B2
(45) Date of Patent: Aug. 2, 2011

(54) DUTY CYCLE CORRECTION CIRCUITS HAVING SHORT LOCKING TIMES THAT ARE RELATIVELY INSENSITIVE TO TEMPERATURE CHANGES

(75) Inventors: Harmendra Panditd, Yongin-si (KR); Su Ho Kim, Yongin-si (KR); Won Lee, Gunpo-si (KR); Alex Joo, Yongin-si (KR); Kwan Yeob Chae, Seoul (KR); Jong-Ryun Choi, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/603,717

(22) Filed: Oct. 22, 2009

(65) Prior Publication Data

US 2010/0097112 A1 Apr. 22, 2010

(30) Foreign Application Priority Data

Oct. 22, 2008 (KR) .......................... 10-2008-0103828

(51) Int. Cl.
*H03K 3/017* (2006.01)
(52) U.S. Cl. ........................................ 327/175; 327/172

(58) Field of Classification Search .................. None
See application file for complete search history.

(56) References Cited

U.S. PATENT DOCUMENTS

| 5,614,855 | A  | * | 3/1997  | Lee et al. .................. 327/158 |
| 6,934,215 | B2 |   | 8/2005  | Chung et al. |
| 7,148,731 | B2 | * | 12/2006 | Minzoni ..................... 327/175 |
| 7,298,193 | B2 |   | 11/2007 | Agarwal et al. |

FOREIGN PATENT DOCUMENTS

| KR | 1020050103698 A | 11/2005 |
| KR | 1020060013205 A | 2/2006 |

* cited by examiner

*Primary Examiner* — Cassandra Cox
(74) *Attorney, Agent, or Firm* — Myers Bigel Sibley & Sajovec (57) ABSTRACT

A duty cycle correction circuit includes a duty cycle correction portion that is configured to output a correction signal that is obtained by correcting a duty cycle of an input signal and to output a delayed signal that is obtained by delaying the correction signal, a complementary portion that is configured to output a complementary signal that is the complement of the delayed signal, and a phase interpolator that is configured to phase interpolate the complementary signal and the correction signal.

17 Claims, 10 Drawing Sheets

DUTY CYCLE CORRECTION CIRCUITS HAVING SHORT LOCKING TIMES THAT ARE RELATIVELY INSENSITIVE TO TEMPERATURE CHANGES

CROSS-REFERENCE TO RELATED APPLICATION

This application claims priority under 35 U.S.C. §119 to Korean Patent Application No. 10-2008-0103828, filed on 22 Oct., 2008, in the Korean Intellectual Property Office, the disclosure of which is incorporated herein in its entirety by reference.

BACKGROUND

The present invention relates to a circuit for correcting a duty cycle of a clock signal, and more particularly, to duty cycle correction circuits which may be used when a delay line is coarse compared to a conventional duty cycle correction circuits.

Duty cycle correctors are used to provide accurate clock signals in systems such as semiconductor memory devices. In particular, when a duty cycle of a clock signal is substantially offset from a value of 50% in a semiconductor memory device using a double data rate (DDR) interface, the width of a data section output at a rising edge of the clock signal is different from that of a data section output at a falling edge of the clock signal. Thus, the role of the duty cycle corrector is important.

SUMMARY

Pursuant to certain embodiments of the present invention, duty cycle correction circuits are provided that include a duty cycle correction portion that is configured to output a correction signal that is obtained by correcting a duty cycle of an input signal and to output a delayed signal that is obtained by delaying the correction signal, a complementary portion that is configured to output a complementary signal that is the complement of the delayed signal, and a phase interpolator that is configured to phase interpolate the complementary signal and the correction signal.

The complementary portion may comprise an inverter. The phase interpolator may include a first inverter that receives the correction signal and a second inverter that receives the complementary signal and a third inverter having an input terminal connected to the output of the first inverter and an output of the second inverter.

The duty cycle correction portion may include an output portion that receives the input signal and is configured to output the correction signal, and a control portion that is configured to output a first delayed signal obtained by delaying a phase of the correction signal for a first time and to output a control signal to the output portion to correct a duty cycle of the correction signal.

The control portion may include a first delay unit that is configured to generate the first delayed signal, a sampling unit that is configured to sample the correction signal in synchronism with the first delayed signal, and a control logic unit that is configured to output the control signal to the output portion and to the first delay unit based on a sampling value output from the sampling unit.

The output portion may include a divider that is configured to divide the input signal and output a divided signal, a second delay unit that is configured to delay a phase of the divided signal by the first time and output a second delayed signal, a logic operation unit that is configured to perform a logic operation on the divided signal and the second delayed signal, and a fourth inverter that is configured to invert a signal output from the logic operation unit to generate the correction signal.

Pursuant to further embodiments of the present invention, duty cycle correction circuits are provided that include a complementary portion that is configured to output a complementary signal that is the complement of a first signal obtained by performing a coarse correction of duty cycle of an input signal and a phase interpolator that is configured to phase interpolate the complementary signal and the first signal.

Pursuant to further embodiments of the present invention, duty cycle correction circuits are provided that include a duty cycle correction circuit that is configured to output a correction signal that is obtained by correcting a duty cycle of the input signal and a delayed signal that is obtained by delaying the correction signal and a supplemental duty cycle correction circuit that is configured to receive an output signal of the duty cycle correction circuit and that is configured to correct a duty cycle of the output signal.

BRIEF DESCRIPTION OF THE DRAWINGS

Exemplary embodiments of the present invention will be more clearly understood from the following detailed description taken in conjunction with the accompanying drawings in which.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 1:
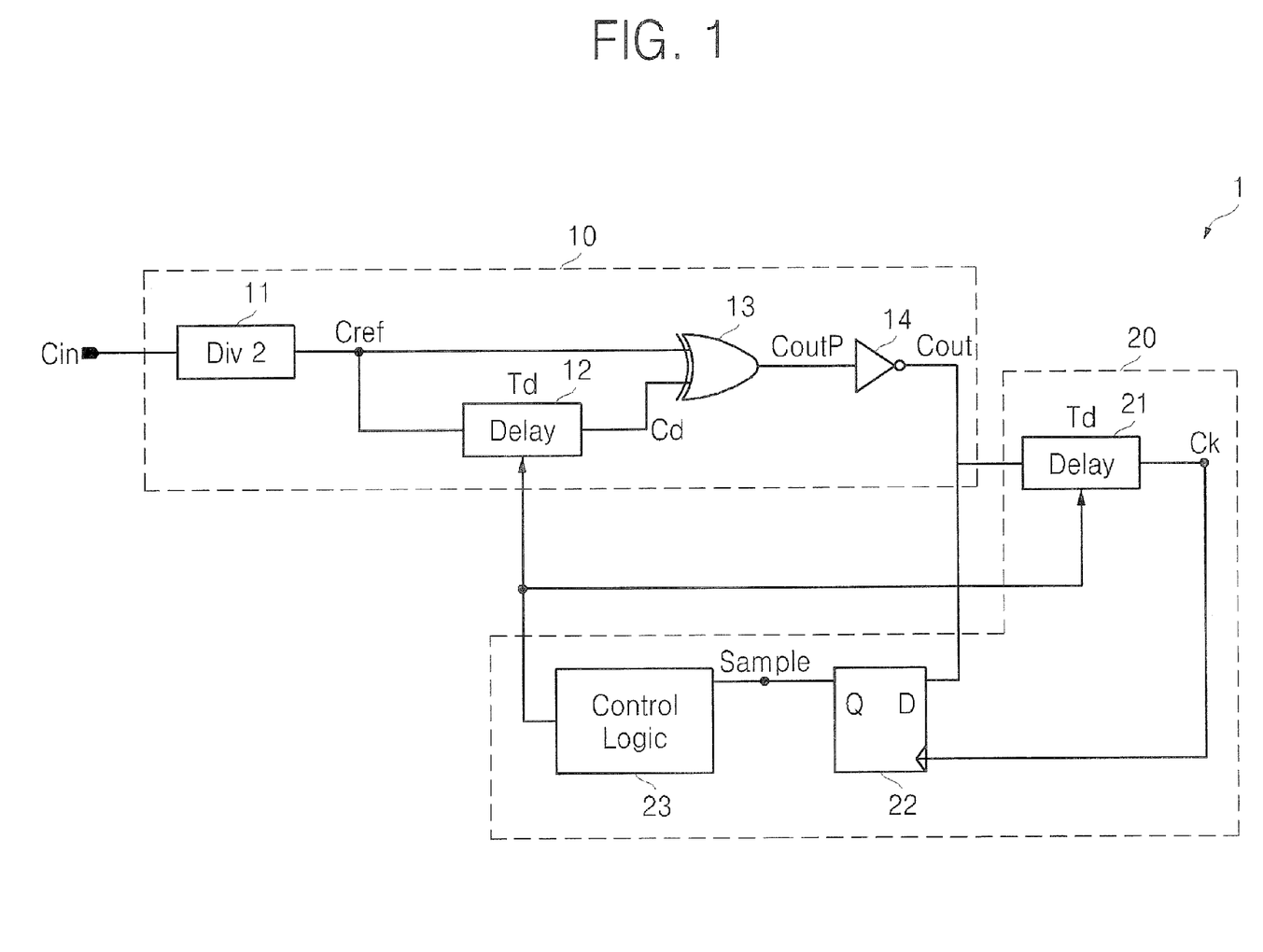
FIG. 1 is a circuit diagram of a conventional feedback duty cycle correction circuit.

FIG. 1 is a circuit diagram of a conventional feedback duty correction circuit 1. Referring to FIG. 1, the conventional duty cycle correction circuit 1 includes a duty cycle correction unit 10 and a control unit 20. The duty cycle correction unit 10 corrects the duty cycle of an input clock signal Cin and outputs an output clock signal Cout that has the corrected duty cycle. The duty cycle correction unit 10 includes a ½ divider 11, a first delay unit 12, an XOR logic operation unit 13, and an inverter 14. The amount of correction of a duty cycle that may be achieved by the duty cycle correction unit 10 is determined by the amount that the first delay unit 12 delays the phase of a signal input thereto. The amount of delay is determined by the control unit 20. The control unit 20 may include a second delay unit 21, a sampling unit 22, and control logic 23.

Figure 2:
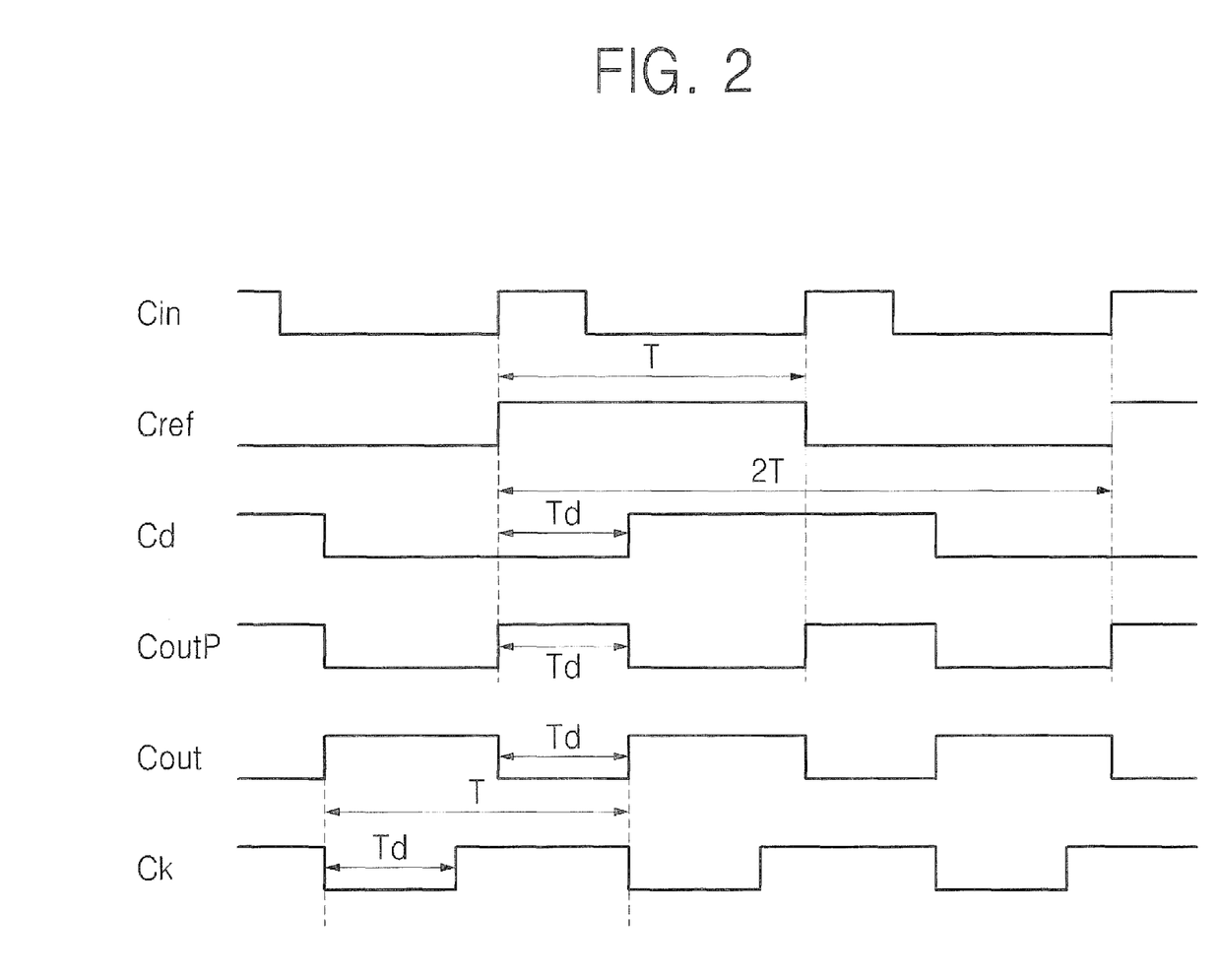
FIG. 2 is a timing diagram for the duty cycle correction circuit of FIG. 1.

FIG. 2 is a timing diagram of the duty correction circuit 1 of FIG. 1. Referring to FIGS. 1 and 2, the input clock signal Cin is divided by the ½ divider 11 into a ½ divided clock signal Cref that has a frequency that is ½ the frequency of Cin. Thus, the ½ divided clock signal Cref has a first logic level and a second logic level, each of which are as long as the cycle period of the input clock signal Cin. The clock signal Cref is input to one of the input terminals of the XOR logic operation unit 13. The clock signal Cref is also input to the first delay unit 12. The first delay unit 12 delays the phase of the divided clock signal Cref by a delay Td to provide a clock signal Cd. The clock signal Cd is input to the other input terminal of the XOR logic operation unit 13. The XOR logic operation unit 13 performs an XOR operation to generate a signal CoutP. The signal CoutP is then inverted by the inverter 14 to provide a corrected signal Cout.

As illustrated in FIG. 2, the corrected signal Cout is a signal in which the duty cycle of the input clock signal Cin is corrected. The duty cycle of the corrected signal Cout is determined by the value of the delay Td. The corrected signal Cout is input to the control unit 20, where it is delayed by the second delay unit 21. The second delay unit 21 delays the corrected signal Cout by the same amount of delay Td as the first delay unit 12, and outputs a delayed signal Ck. The sampling unit 22 samples the corrected signal Cout in synchronism with the delayed signal Ck.

As shown in the timing diagram of FIG. 2, a sampled value of the corrected signal Cout at the rising edge of the delayed signal Ck has a first logic level, for example, "HIGH." The sampled value having the first logic level may denote that the degree of delay Td needs to be increased, as illustrated in FIG. 2. Thus, the control logic 23 may increase the value of the delay Td by outputting a control signal to the first and second delay units 12 and 21. The first and second delay units 12 and 21 may be implemented as delay lines. Each delay line may be formed of a plurality of delay cells that are connected in series.

The conventional feedback duty correction circuit 1 may correct the duty cycle of the clock signal Cin in the manner described above. However, in the conventional feedback duty correction circuit 1, the duty cycle of the corrected signal Cout and the correction of the duty cycle are determined by the value of the delay Td, which, as noted above, is typically determined by selecting the number of delay cells in a delay line. When the amount of delay provided by each unit of the delay line is large, accurate correction of the duty cycle is difficult. Thus, in order to provide accurate duty cycle correction, the resolution of each of the first and second delay units 12 and 21 may be increased (i.e., each delay cell is designed to have a smaller delay), and the total number of delay cells included in the first and second delay units 12 and 21 may be increased. When the number of cells in each of the first and second delay units 12 and 21 is increased, the number of steps for locking the duty cycle at a desired level (e.g., 50%) increases. Therefore, the locking time increases.

The value of the delay Td provided by the first and second delay units 12 and 21 may vary with temperature. FIGS. 3A and 3B are timing diagrams that illustrate how the value of the delay Td provided by the first and second delay units 12 and 21 may vary with changes in temperature. In particular, FIG. 3A illustrates how the amount of delay provided by the first and second delay units 12 and 21 may be increased based on a change in temperature. FIG. 3B illustrates how the amount of delay provided by the first and second delay units 12 and 21 may be decreased based on a change in temperature. In both cases, the value of Td is changed as a result of the change in temperature, which may introduce an error in the duty cycle of the corrected clock signal Cout as is illustrated in FIGS. 3A and 3B.

To address this problem, the conventional feedback duty cycle correction circuit 1 repeats the above-described process for correcting the duty cycle again, and a new value of Td is determined that provides an output clock signal Cout that has the correct duty cycle.

Figure 4:
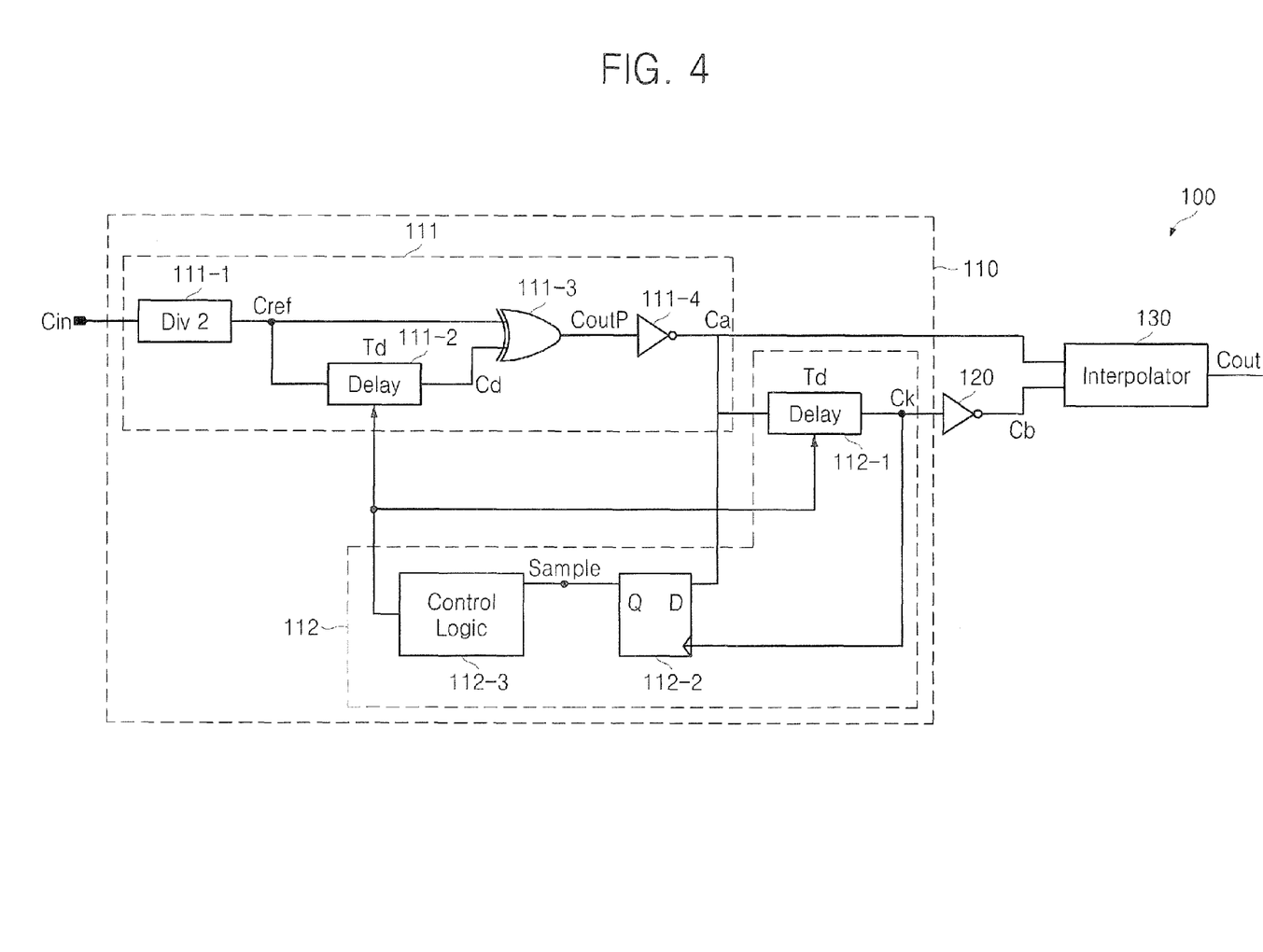
FIG. 4 is a circuit diagram illustrating the structure of a duty cycle correction circuit according to an exemplary embodiment of the present invention.

FIG. 4 is a circuit diagram of a duty cycle correction circuit 100 according to some embodiments of the present invention. Referring to FIG. 4, the duty cycle correction circuit 100 includes a correction portion 110, a complementary portion 120, and a phase interpolator 130. The correction portion 110 may include an output portion 111 and a control portion 112. The output portion 111 may include a divider 111-1, a first delay unit 111-2, a logic operation unit 111-3, and an inverter 111-4. The control portion 112 may include a second delay unit 112-1, a sampling unit 112-2, and control logic 112-3.

The complementary portion 120 may comprise an inverter having a predetermined delay δ. The correction portion 110 may receive the input signal Cin and output a correction signal Ca and a delayed signal Ck. The correction portion 110 may generate the correction signal Ca by correcting the duty cycle of the input signal Cin, and may generate the delayed signal Ck by delaying the phase of the correction signal Ca by a predetermined time.

The complementary portion 120 receives the delayed signal Ck and outputs a signal Cb that is the complement of the delayed signal Ck. The sum of the duty cycles of the delayed signal Ck and the complementary signal Cb is 100%. Thus, the length of the first logic level section of the delayed signal Ck is the same as the length of the second logic level section of the complementary signal Cb, and the length of the second logic level section of the delayed signal Ck is the same as the length of the first logic level section of the complementary signal Cb.

The phase interpolator 130 may phase interpolate the complementary signal Cb and the correction signal Ca. The phase interpolator 130 may generate and output a signal Cout that has an average phase of the complementary signal Cb and the correction signal Ca.

The correction portion 110 has a structure similar to that of the conventional feedback duty cycle correction circuit 1 of FIG. 1. However, the duty cycle correction circuit 100 according to the present exemplary embodiment further includes the complementary portion 120 and the phase interpolator 130.

As shown in FIG. 1, the input signal Cin is divided by the divider 111-1 to produce the divided signal Cref. The divider 111-1 may be a ½ divider. The divided signal Cref has a first logic level and a second logic level, each of which are as long as the cycle period of the input signal Cin. The divided signal Cref is input to one of the input terminals of the logic operation unit 111-3. The divided signal Cref is also input to the first delay unit 111-2 which delays the phase of the divided signal Cref by the delay Td to thereby produce a signal Cd. The signal Cd is input to the other input terminal of the logic operation unit 111-3. The logic operation unit 111-3 performs an XOR operation to generate a signal CoutP. The generated signal CoutP is inverted by the inverter 111-4 to provide the correction signal Ca. As described above with reference to FIG. 2, the correction signal Ca is a signal in which the duty cycle of the input signal Cin is corrected by a predetermined amount. The duty cycle of the correction signal Ca is determined by the value of the delay Td.

The correction signal Ca is input to the control portion 112, where it is delayed by the second delay unit 112-1 by the delay Td. The second delay unit 112-1 delays the correction signal Ca by the same amount of delay as the first delay unit 111-1, and outputs the delayed signal Ck. The sampling unit 112-2 samples the correction signal Ca in synchronism with the delayed signal Ck.

Figure 5:
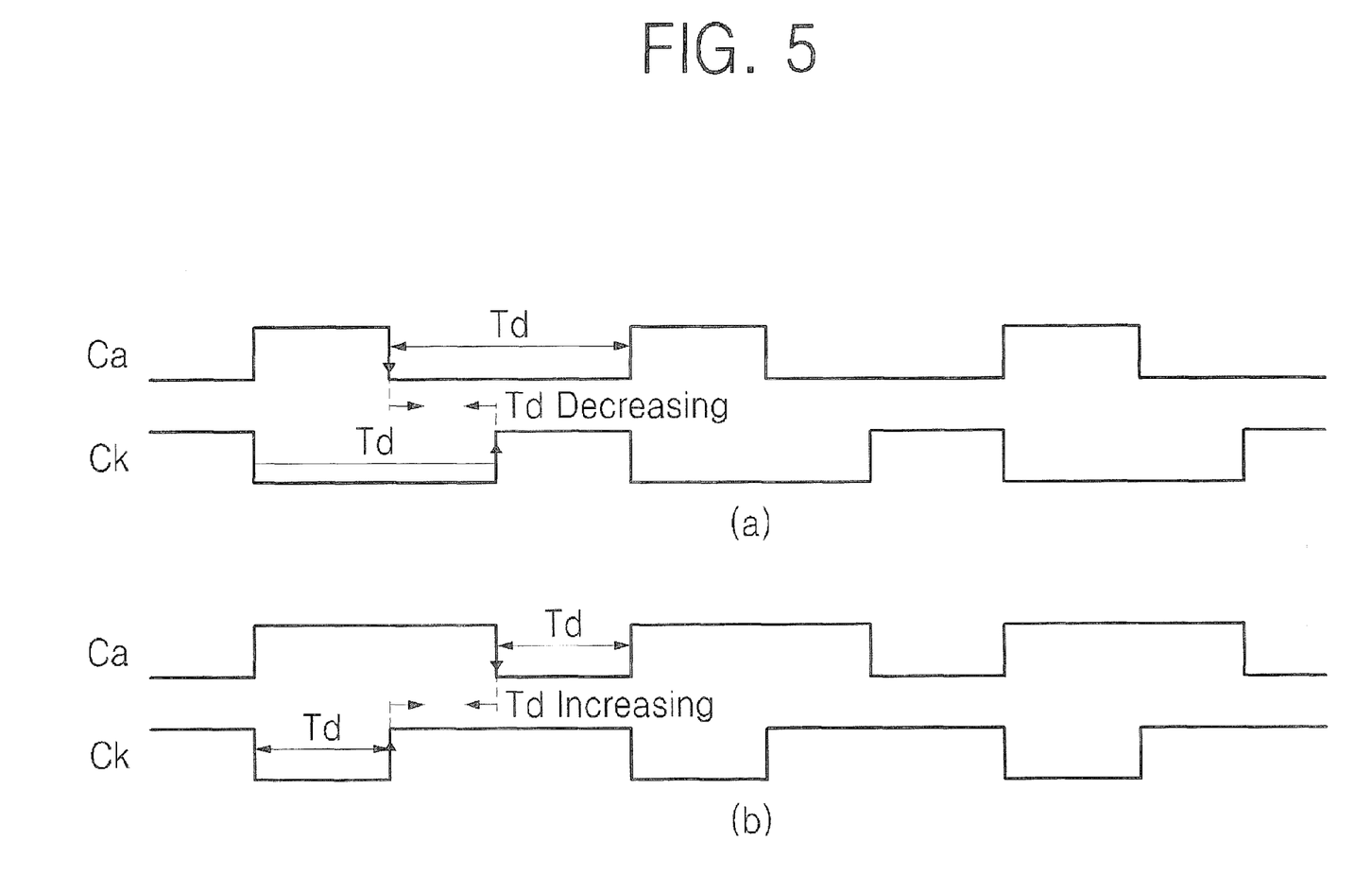
FIGS. 5A and 5B are timing diagrams that illustrate a process for correcting the duty cycle of a clock signal that may be performed using the duty cycle correction circuit of FIG. 4.

FIGS. 5A and 5B are timing diagrams that illustrate a process for correcting the duty cycle of a clock signal that may be performed using the duty cycle correction circuit 100 of FIG. 4.

In the timing diagram of FIG. 5A, a sampled value of the correction signal Ca at the rising edge of the delayed signal Ck has a second logic level, for example, "LOW." The sampled value having the second logic level may denote that the delay Td needs to be decreased. Thus, the control logic 112-3 outputs a predetermined control signal to the first and second delay units 111-2 and 112-1 to decrease the value of the delay Td.

In the timing diagram of FIG. 5B, a sampled value of the correction signal Ca at the rising edge of the delayed signal Ck has a first logic level, for example, "HIGH." The sampled value having the first logic level may denote that the delay Td needs to be increased. Thus, the control logic 112-3 outputs a predetermined control signal to the first and second delay units 111-2 and 112-1 to increase the value of the delay Td.

The first and second delay units 111-2 and 112-1 may be implemented as delay lines. Each delay line may comprise a plurality of delay cells that are connected in series. The control logic 112-3 may lock the delay Td of the first and second delay units 111-2 and 112-1 when the duty cycle is 50%.

Figure 6:
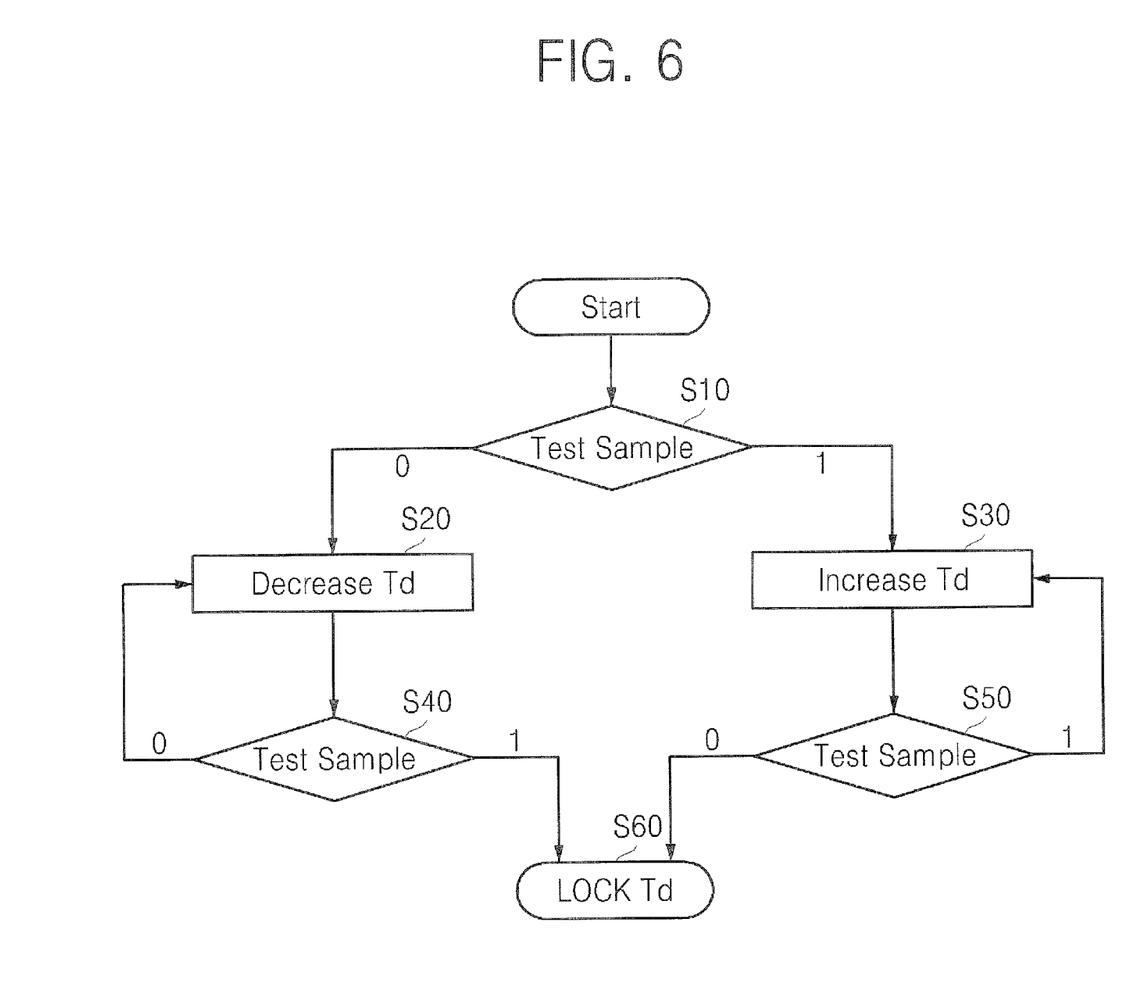
FIG. 6 is a flowchart illustrating a locking algorithm of control logic of the duty correction circuit of FIG. 4.

FIG. 6 is a flowchart that illustrates the locking algorithm of the control logic 112-3 of the duty cycle correction circuit 100 of FIG. 4. As shown in FIG. 6, when the locking process starts, the control logic 112-3 tests the sample value of the correction signal Ca (block S10). When a test result is the second logic level "0", the control logic 112-3 decreases the delay Td (block S20) by, for example, outputting a predetermined control signal to the first and second delay units 111-2 and 112-1. Then, the control logic 112-3 again tests the sample value (block S40). If, at block S40, the test result is the second logic level "0", the control logic 112-3 again decreases the delay Td (block S20). If instead at block S40 the test result is the first logic level "1" (i.e., if the logic level of the sampled value has changed), the control logic 112-3 locks the delay Td (block S60). The control logic 112-3 may repeat the operations of blocks S40 and S20 until the logic level of the sampled value changes.

If, at block S10, the test result is the first logic level "1", the control logic 112-3 increases the degree of delay Td (block S30) by, for example, outputting a predetermined control signal to the first and second delay units 111-2 and 112-1. Then, the control logic 112-3 again tests the sample value (block S50). If, at block S50, the test result is the first logic level "1", the control logic 112-3 again increases the delay Td (block S30). If instead at block S50 the test result is the second logic level "0" (i.e., if the logic level of the sampled value has changed), the control logic 112-3 locks the delay Td (block S60). The control logic 112-3 may repeat the operations of blocks S50 and S30 until the logic level of the sampled value changes.

Figure 7:
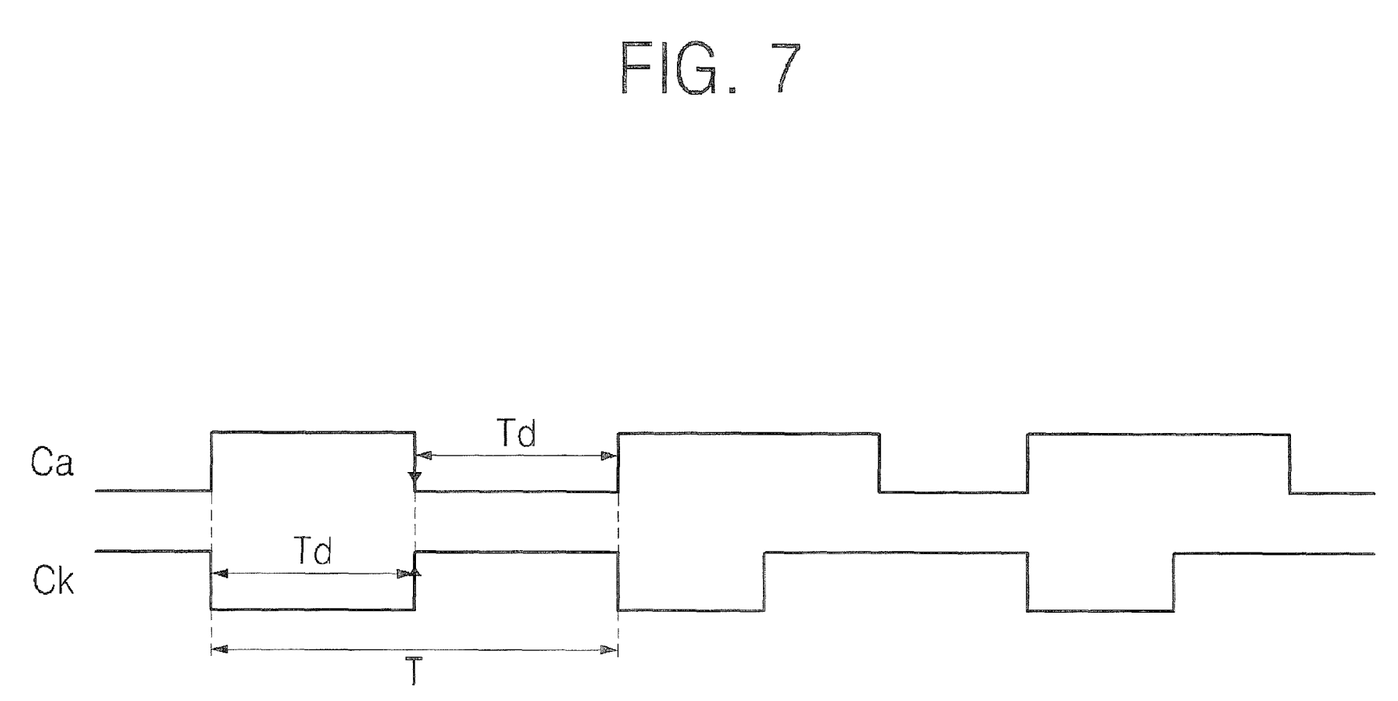
FIG. 7 is a timing diagram of a correction signal Ca and a delayed signal Ck after locking, according to an exemplary embodiment of the present invention.

FIG. 7 is a timing diagram that illustrates the timing of the correction signal Ca and the delayed signal Ck after the control logic 112-3 locks the delay Td as described above with reference to FIG. 6. As shown in FIG. 7, when the control logic 112-3 locks the delay Td, the correction signal Ca has a 50% duty cycle. However, in order to timely lock the delay Td just at the point where the correction signal Ca has a 50% duty cycle, the unit value of the delay Td (i.e., the delay associated with each unit cell in the delay line) should be very precise. That is, when the delay Td is increased or decreased by one unit, if the unit value of the delay is large, it is difficult to accurately achieve a 50% duty cycle. Thus, when the duty cycle correction circuit only includes the correction portion 110 as in the conventional circuit of FIG. 1, a delay line having a high resolution may be required. However, since the duty correction circuit 100 according to the present exemplary embodiment additionally includes the compensation portion 120 and the phase interpolator 130, this shortcoming may be addressed.

Figure 10:
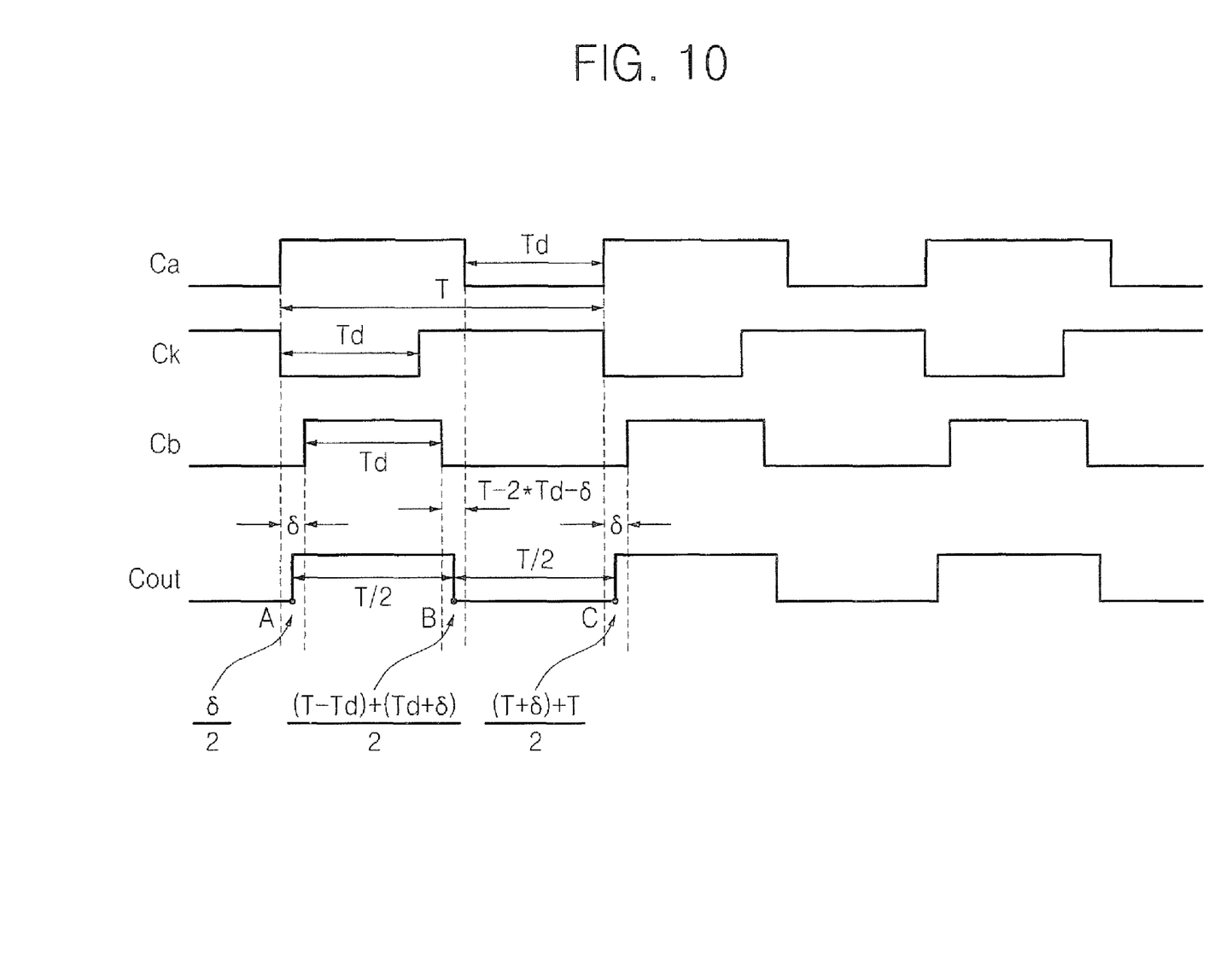
FIG. 10 is a timing diagram of signals of the duty cycle correction circuit of FIG. 4.

FIG. 10 is a timing diagram of signals of the duty cycle correction circuit 100 of FIG. 4. Referring to FIGS. 4 and 10, when a coarse delay unit, that is, a delay line, is used, the correction signal Ca may not have an accurate 50% duty cycle, as illustrated in FIG. 10. Accordingly, the duty cycle of the delay signal Ck may not be 50%. The complementary portion 120 may generate the complementary signal Cb of the delay signal Ck. The inverter 120 used to implement the complementary portion 120 has an associated delay of δ. Thus, as shown in FIG. 10, the signal Cb that is output by the complementary portion is the complement of signal Ck, delayed by the delay δ.

It may be seen from FIG. 10 that the interval between the rising edge of the correction signal Ca and the rising edge of the complementary signal Cb is δ, and that the interval between the falling edge of the correction signal Ca and the falling edge of the complementary signal Cb is T−2*Td−δ.

The phase interpolator 130 interpolates the phases of the correction signal Ca and the complementary signal Cb to generate a signal Cout having an average phase delay of the correction signal Ca and the complementary signal Cb, as illustrated in FIG. 10.

Figure 8:
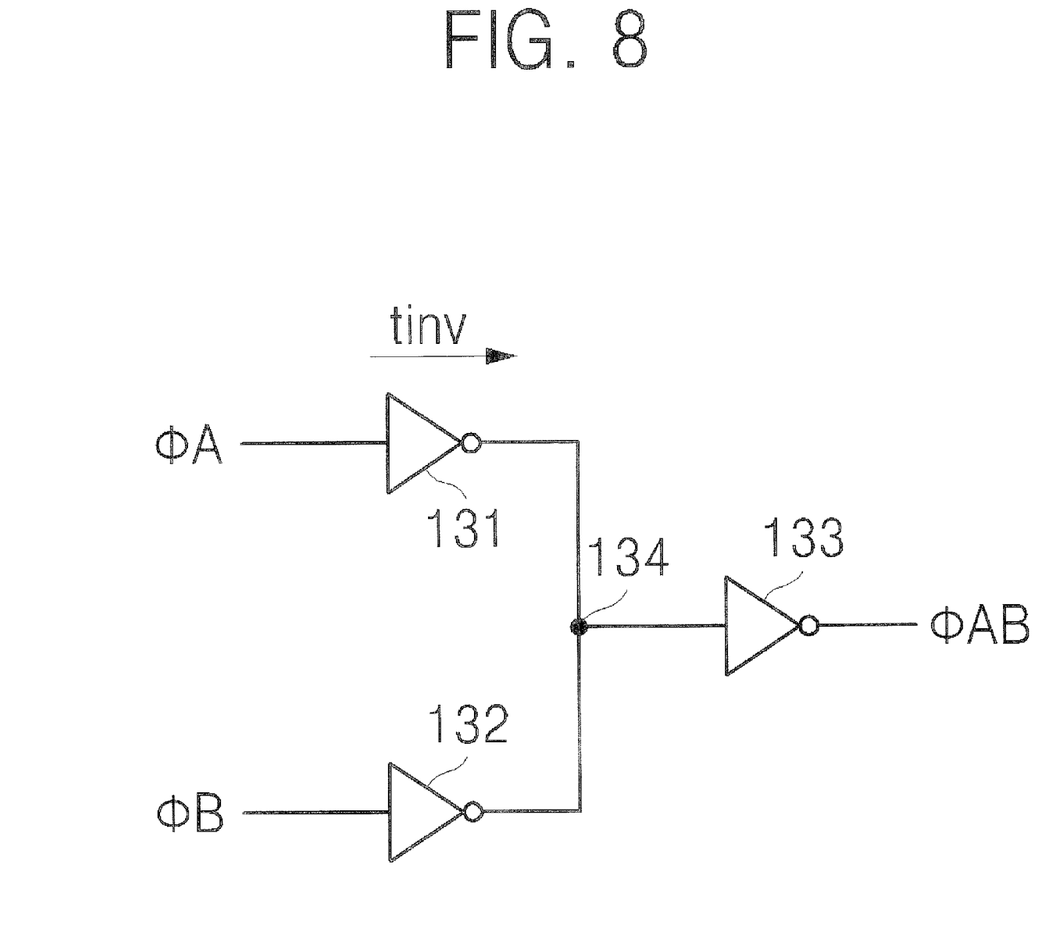
FIG. 8 is a circuit diagram illustrating the structure of a phase interpolator according to an exemplary embodiment of the present invention.

FIG. 8 is a circuit diagram illustrating the structure of the phase interpolator 130 according to an exemplary embodiment of the present invention. As shown in FIG. 8, the phase interpolator 130 includes a first inverter 131 and a second inverter 132 that respectively receive the correction signal Ca and the complementary signal Cb. The first and second inverters 131, 132 have a common output terminal 134. A third inverter 133 is connected to the output terminal 134. Thus, the rising edge the output signal ΦAB of the phase interpolator 130 may be generated between the rising edges of the two input signals ΦA and ΦB, and the falling edge of the output signal ΦAB of the phase interpolator 130 may be between the falling edges of the two input signals ΦA and ΦB. The phase difference between the two input signals ΦA and ΦB of the phase interpolator 130 needs to be smaller than the tolerance $t_{inv}$ of the phase interpolator 130.

Figure 9:
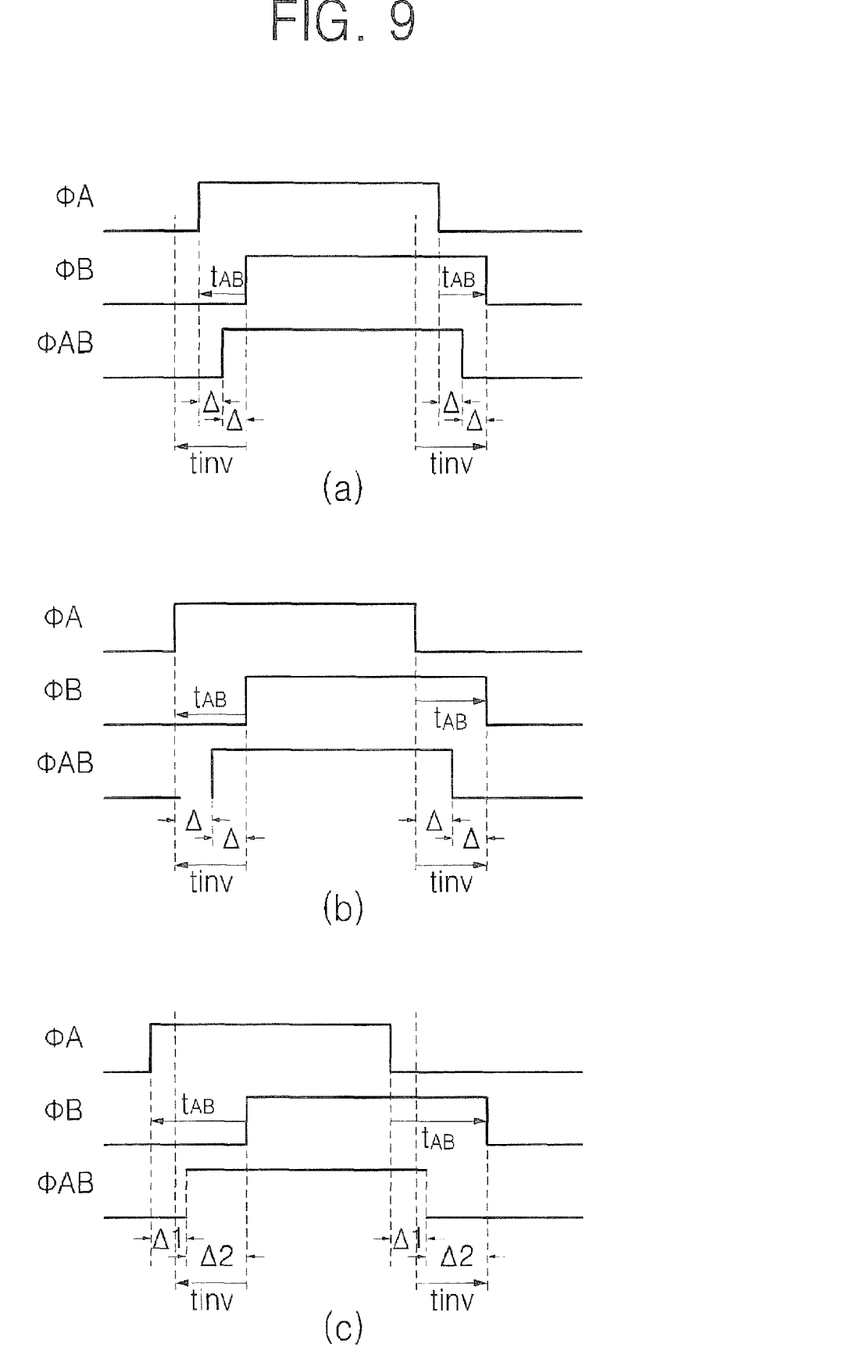
FIGS. 9A, 9B, and 9C are timing diagrams that illustrate the relationship between the tolerance of the phase interpolator and a phase difference between input signals, according to an exemplary embodiment of the present invention.

FIGS. 9A, 9B, and 9C are timing diagrams that illustrate the tolerance of the phase interpolator 130 and the phase difference between the input signals, according to an exemplary embodiment of the present invention. In FIG. 9A, the tolerance $t_{inv}$ of the phase interpolator 130 is greater than the phase difference $t_{AB}$. In FIG. 9B, the tolerance $t_{inv}$ of the phase interpolator 130 is the same as the phase difference $t_{AB}$. In FIG. 9C, the tolerance $t_{inv}$ of the phase interpolator 130 is smaller than the phase difference $t_{AB}$. Referring to FIG. 9C, it may be seen that the phase of the output signal ΦAB is not located at the middle position of the phases of the two input signals ΦA and ΦB when the tolerance $t_{inv}$ of the phase interpolator 130 is smaller than the phase difference $t_{AB}$. The tolerance $t_{inv}$ may be met by allowable deviation, i.e. allowable phase difference between two input signal of the phase interpolator 130.

Thus, referring back to FIG. 10, the difference between the interval δ between the rising edge of the correction signal Ca and the rising edge of the complementary signal Cb and the interval T−2*Td−δ between the falling edge of the correction signal Ca and the falling edge of the complementary signal Cb needs to be smaller than the tolerance $t_{inv}$ of the phase interpolator 130. That is, the following inequalities need to be satisfied.

$$T-2*Td-\delta < t_{inv} \quad \text{[Inequality 1]}$$

$$\delta < t_{inv} \quad \text{[Inequality 2]}$$

When Inequalities 1 and 2 are satisfied, the waveform of the output signal Cout whose phase is interpolated becomes the one illustrated in FIG. 10. In particular, when Inequalities 1 and 2 are satisfied, the phase of the rising edge A of the output signal Cout is δ/2 after the rising edge of the correction signal Ca, and the phase of the falling edge B is [(T−Td)+(Td+δ)]/2 before the falling edge of the correction signal Ca. Also, the phase of the next rising edge C is [(T+δ)+T]/2 after the rising edge of the previous pulse of the correction signal Ca. Thus, the length of the first logic level section of the output signal Cout satisfies the following equation.

$$\text{High phase of Cout}=B-A=[(T-Td)+(Td+\delta)]/2-(\delta/2)=T/2 \quad \text{[Equation 1]}$$

The length of the second logic level section of the output signal Cout satisfies the following equation.

$$\text{Low phase of Cout}=C-B=[(T+\delta)+T]/2-[(T-Td)+(Td+\delta)]/2=T/2 \quad \text{[Equation 2]}$$

It may be seen from Equations 1 and 2 that the duty cycle of the output signal Cout is corrected to 50%. Thus, it may be seen that the duty cycle of Cout is accurately corrected to 50% by the complementary portion 120 and the phase interpolator 130, even when the duty cycle of the correction signal Ca output from the correction portion 110 is not accurately 50% because the degree of delay Td locked by the correction portion 110 was not sufficiently precise.

Thus, even when a short (course) delay line is used, the duty cycle correction circuit 100 according to the present exemplary embodiment may provide an accurate duty cycle correction. Since short delay lines may thus be used, the locking time may be shortened. The duty cycle may be accurately corrected if the locked delay Td satisfies Inequalities 1 and 2 above.

Figure 3:
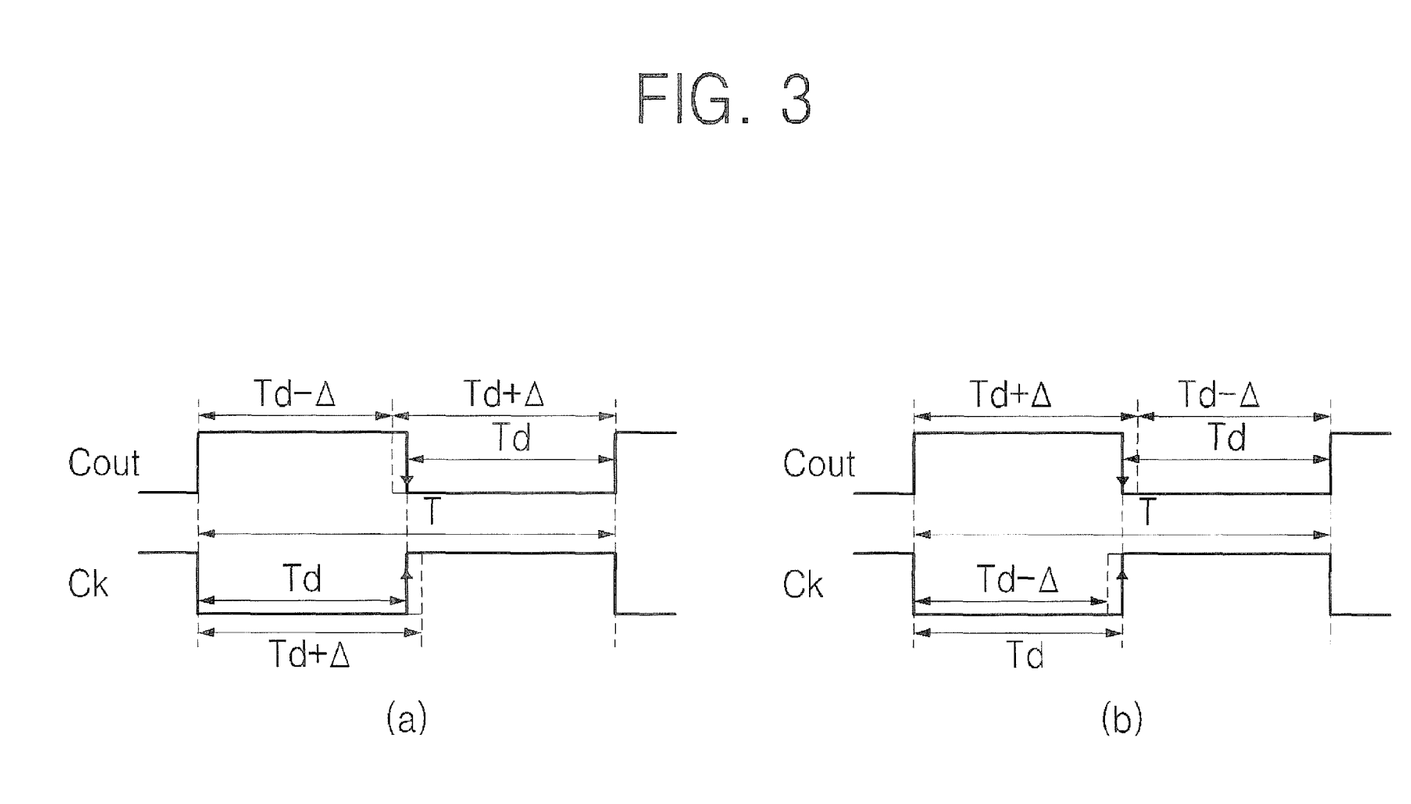
FIGS. 3A and 3B are timing diagrams that illustrate how the amount of delay provided by a delay unit may vary with changes in temperature.

Also, when the value of the locked delay Td changes to Td±Δ in response to a change in temperature, as illustrated in FIG. 3, it may seen from Equations 1 and 2 that the length of the first logic level section and the second logic level section of the output signal Cout is T/2 is not effected by the change in the value of the delay Td. Thus, when the following inequality is satisfied, the duty cycle may be corrected insensitively to a change in temperature to a certain degree.

$$T-2*(Td\pm\Delta)-\delta < t_{inv} \quad \text{[Inequality 3]}$$

That is, when Inequality 3 is satisfied, the duty cycle may be maintained at 50% without performing an additional locking process by the correction portion 110 even though the value of Td changes due to a change in temperature.

As described above, in the duty cycle correction circuit according to embodiments of the present invention, since a delay line is implemented to be short, even when a coarse delay line is in use, accurate duty correction may be performed. Thus, the area occupied by the duty correction circuit in a system decreases so that a compact system may be manufactured. Also, since the locking time is shortened, the duty correction circuit may correct the duty cycle within a shorter time so that performance of the system may be improved. Furthermore, since there is no change in the duty cycle in spite of a change in temperature, there is no need to correct the duty cycle again.

While inventive concepts have been particularly shown and described with reference to embodiments thereof, it will be understood that various changes in form and details may be made therein without departing from the spirit and scope of the following claims.

What is claimed is:

1. A duty cycle correction circuit comprising:
a duty cycle correction portion that is configured to output a correction signal that is obtained by correcting a duty cycle of an input signal and to output a delayed signal that is obtained by delaying the correction signal;
a complementary portion that is configured to output a complementary signal that is the complement of the delayed signal; and
a phase interpolator that is configured to phase interpolate the complementary signal and the correction signal.

2. The duty cycle correction circuit of claim 1, wherein the complementary portion comprises an inverter.

3. The duty cycle correction circuit of claim 1, wherein the phase interpolator comprises:
a first inverter that receives the correction signal;
a second inverter that receives the complementary signal; and
a third inverter having an input terminal connected to an output of the first inverter and an output of the second inverter.

4. The duty cycle correction circuit of claim 1, wherein the duty cycle correction portion comprises:
an output portion that receives the input signal and is configured to output the correction signal; and
a control portion that is configured to output a first delayed signal obtained by delaying a phase of the correction signal for a first time and to output a control signal to the output portion to correct a duty cycle of the correction signal.

5. The duty cycle correction circuit of claim 4, wherein the control portion comprises:
a first delay unit that is configured to generate the first delayed signal;
a sampling unit that is configured to sample the correction signal in synchronism with the first delayed signal; and
a control logic unit that is configured to output the control signal to the output portion and to the first delay unit based on a sampling value output from the sampling unit.

6. The duty cycle correction circuit of claim 5, wherein the output portion comprises:
a divider that is configured to divide the input signal and output a divided signal;
a second delay unit that is configured to delay the divided signal by the first time and output a second delayed signal;
a logic operation unit that is configured to perform a logic operation on the divided signal and the second delayed signal; and
an inverter that is configured to invert a signal output from the logic operation unit to generate the correction signal.

7. The duty cycle correction circuit of claim 1, wherein the complementary portion and the phase interpolator are configured to correct a duty cycle of the correction signal.

8. The duty cycle correction circuit of claim 1, wherein an output of the phase interpolator has a phase delay that is an average of a phase delay of the complementary signal and a phase delay of the correction signal.

9. The duty cycle correction circuit of claim 1, wherein the output of the phase interpolator will have a duty cycle of substantially 50% if a delay associated with the complementary portion is less than a tolerance of the phase interpolator and the period of the input signal minus twice a locked delay of the duty cycle correction circuit minus the delay associated with the complementary portion is less than the tolerance of the phase interpolator.

10. A duty cycle correction circuit comprising:
a complementary portion that is configured to output a complementary signal that is the complement of a first signal obtained by performing a coarse correction of duty cycle of an input signal; and
a phase interpolator that is configured to phase interpolate the complementary signal and the first signal.

11. The duty cycle correction circuit of claim 10, wherein the complementary portion comprises an inverter.

12. The duty cycle correction circuit of claim 10, wherein the phase interpolator comprises:
a first inverter that receives the first signal;
a second inverter that receives the complementary signal; and
a third inverter having an input terminal connected to an output of the first inverter and an output of the second inverter.

13. The duty cycle correction circuit of claim 10, wherein the complementary portion and the phase interpolator are configured to correct a duty cycle of the first signal.

14. The duty cycle correction circuit of claim 10, wherein an output of the phase interpolator has a phase delay that is an average of a phase delay of the complementary signal and a phase delay of the first signal.

15. A duty cycle correction circuit comprising:
a duty cycle correction circuit that is configured to output a correction signal that is obtained by correcting a duty cycle of an input signal and a delayed signal that is obtained by delaying the correction signal; and
a supplemental duty cycle correction circuit that is configured to receive an output signal of the duty cycle correction circuit and that is configured to correct a duty cycle of the output signal, the supplementary duty cycle correction circuit comprising a complementary portion that is configured to output a complementary signal that is the complement of the correction signal; and a phase interpolator that is configured to phase interpolate the complementary signal and the correction signal.

16. The duty cycle correction circuit of claim 15, wherein the complementary portion comprises an inverter that receives the correction signal and outputs the complementary signal.

17. The duty cycle correction circuit of claim 16, wherein the phase interpolator comprises:
a first inverter that receives the correction signal;
a second inverter that receives the complementary signal; and
a third inverter having an input terminal connected to an output of the first inverter and an output of the second inverter.

* * * * *